United States Patent

Kish, Jr. et al.

[11] Patent Number: 6,015,719
[45] Date of Patent: Jan. 18, 2000

[54] TRANSPARENT SUBSTRATE LIGHT EMITTING DIODES WITH DIRECTED LIGHT OUTPUT

[75] Inventors: Fred A. Kish, Jr.; Stephen A. Stockman, both of San Jose, Calif.

[73] Assignee: Hewlett-Packard Company, Palo Alto, Calif.

[21] Appl. No.: 09/066,089

[22] Filed: Apr. 24, 1998

Related U.S. Application Data

[62] Division of application No. 08/962,944, Oct. 24, 1997, Pat. No. 5,793,062.

[51] Int. Cl.$^7$ .................................................. H01L 21/00
[52] U.S. Cl. .................. 438/29; 438/24; 438/46; 438/47; 257/84; 257/85; 257/94; 257/96
[58] Field of Search .................. 438/47, 24, 29, 438/46; 257/94, 96, 97, 84, 85, 90

[56] References Cited

U.S. PATENT DOCUMENTS

5,376,580  12/1994  Kish et al. .
5,502,316  3/1996  Kish et al. ............................ 257/94
5,793,062  8/1998  Kish, Jr. et al. ...................... 257/98

Primary Examiner—Wael Fahmy
Assistant Examiner—Long Pham
Attorney, Agent, or Firm—Pamela Lau Kee

[57] ABSTRACT

Methods for the fabrication of TS LED chips with improved light extraction and optics, particularly increased top surface emission, and the TS LEDs so fabricated are described. Non-absorbing DBRs within the chip permit the fabrication of the LEDs. The transparent DBRs redirect light away from absorbing regions such as contacts within the chip, increasing the light extraction efficiency of the LED. The non-absorbing DBRs can also redirect light toward the top surface of the chip, improving the amount of top surface emission and the on-axis intensity of the packaged LED. These benefits are accomplished with optically non-absorbing layers, maintaining the advantages of a TS LED, which advantages include ~6 light escape cones, and improved multiple pass light extraction.

6 Claims, 13 Drawing Sheets

TRANSPARENT SUBSTRATE LIGHT EMITTING DIODES WITH DIRECTED LIGHT OUTPUT

CROSS REFERENCE TO RELATED APPLICATION(S)

This is a divisional of application Ser. No. 08/962,944 filed on Oct. 24, 1997, now U.S. Pat. No. 5,793,062.

BACKGROUND OF THE INVENTION

The present invention relates generally to the field of light emitting semiconductor devices. More specifically, it relates to transparent substrate ("TS") light emitting diodes ("LED"s). Non-absorbing distributed Bragg reflectors ("DBR"s) are employed to improve the light extraction and optics of a TS LED. The resulting devices exhibit increased flux and intensity compared to known TS LEDs.

A packaged LED is fabricated from a variety of materials, each with a different index of refraction. The index of refraction is usually designated by n, and n varies from ~3.5 in the LED semiconductor chip to ~1.5 in the epoxy used to encapsulate the LED chip. This large difference in refractive indices results in a critical angle for total internal reflection of 25° from the LED the epoxy, as given by Snell's Law $[\theta_c=\sin^{-1}(n1/n2)]$. This relatively small critical angle for total internal reflection, combined with internal light absorption within the LED chip result in the LED's external quantum efficiency being substantially less than its internal quantum efficiency. The ratio of these quantities, external/internal quantum efficiency, is defined as the LED's extraction efficiency.

Figure 1A:
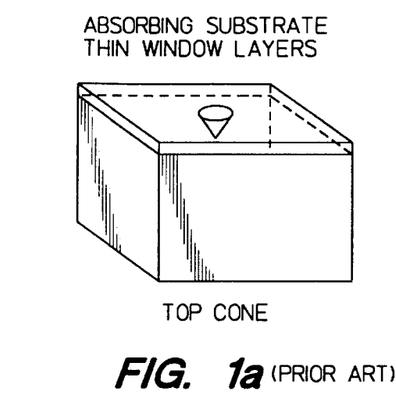
FIGS. 1a, 1b, 1c, and 1d illustrate light extraction from several different LED structures (Prior Art)
Figure 1B:
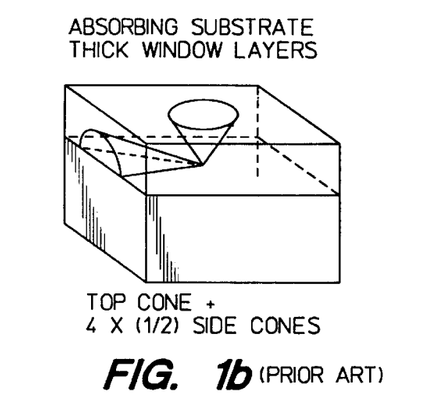
Figure 1C:
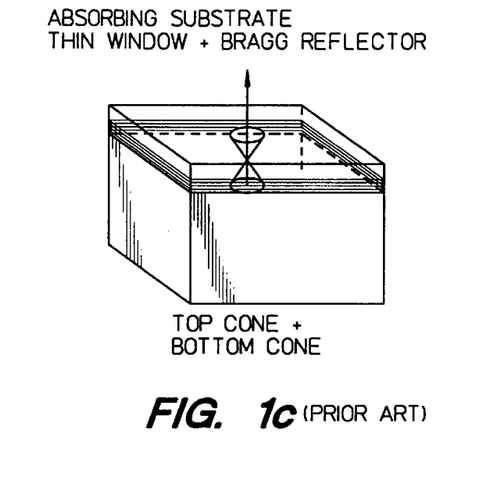

The extraction efficiency of an LED chip is most strongly influenced by the structure of the chip. A variety of LED chip structures and the corresponding escape cones of light defined by their critical angles are depicted schematically in FIGS. 1a, 1b, 1c, and 1d. For each of these figures, the cone model excludes multiple pass light extraction, internal absorption, and randomization effects. For absorbing substrate ("AS") LED chips, the number of escape cones is strongly affected by the thickness of the transparent window layer. An AS LED with a thin transparent window layer (<10 $\mu$m), shown in FIG. 1a, possesses only a single top escape cone. If the thickness of the window layer is increased to >40 $\mu$m, as shown in FIG. 1b, the number of cones increases to three as a result of contributions from the sides of the chip. A DBR mirror, a multiple layer stack of high and low index semiconductor material layers, can be placed between the light emitting active region and the substrate to minimize the substrate's light absorption. However, DBRs only reflect light of near-normal incidence. In an LED, light is emitted isotropically from the active region. Consequently, light of all angles is incident upon the DBR mirror, and only a portion of it is reflected. The remainder passes into the absorbing substrate. In a typical LED with a DBR, only light differing by less than 15°–25° from normal is reflected. Only a portion of the bottom escape cone is reflected by the DBR. Known LED structures with a DBR, shown in FIG. 1c, possess thin transparent windows, which result in a maximum of two escape cones.

Figure 1D:
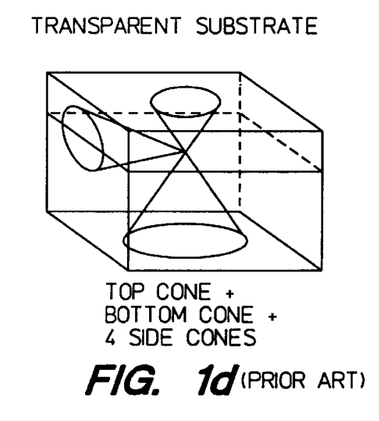
Figure 2:
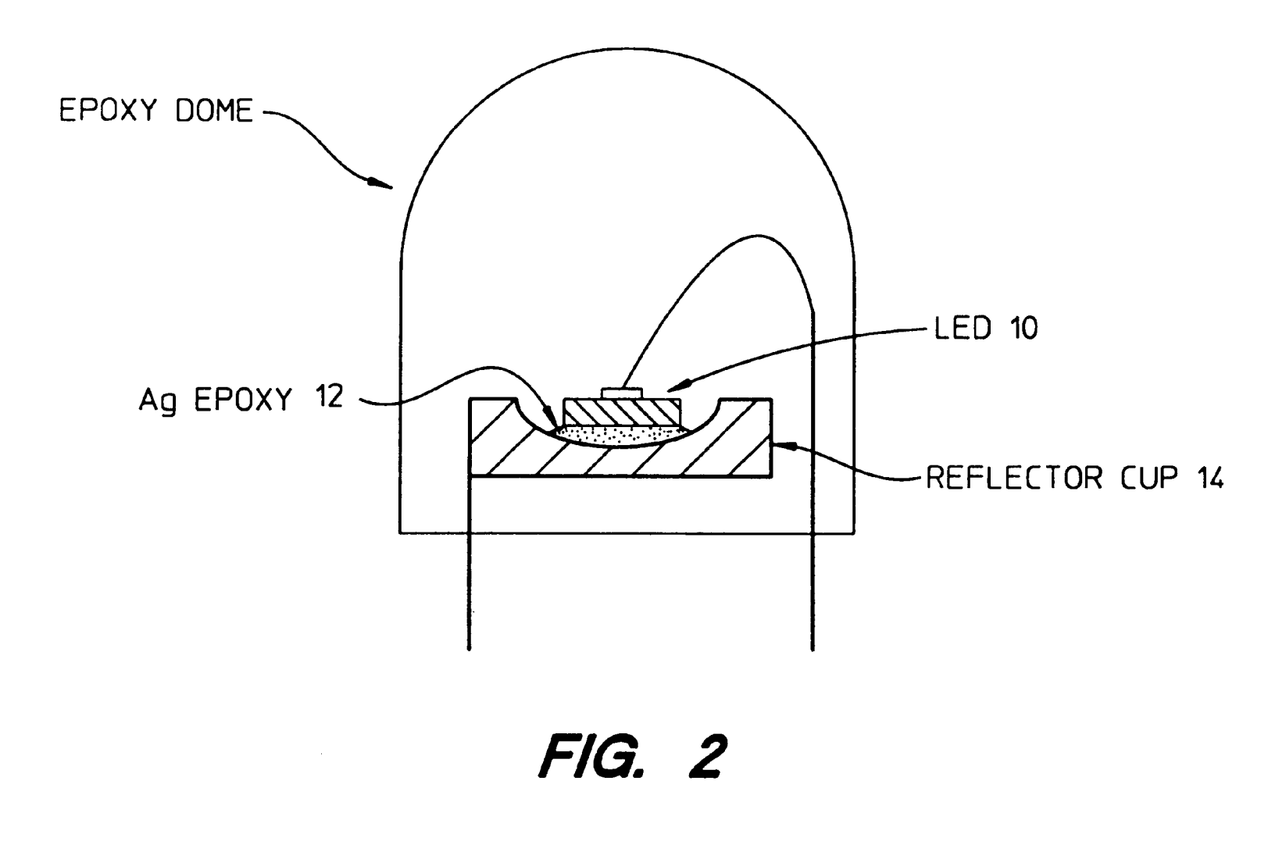
FIG. 2 shows a known packaging system for the LED chip shown in FIG. 1d (Prior Art), FIG. 3 show respectively a known TS LED (Prior Art) and a TS LED fabricated according to the present invention.

The best known structure for light extraction, shown in FIG. 1d, is a TS LED wherein 6 escape cones are possible. Such TS LED chips 10, shown assembled into a finished LED lamp in FIG. 2, are typically mounted with reflective Ag-loaded epoxy 12 in a reflective mold cup 14. A portion of the bottom light cone in this case is captured when it reflects off the Ag-loaded epoxy at the chip's back surface.

The previous discussion did not include the effects of multiple reflection events or randomization of light within the LED. In chips with thick transparent window regions, especially TS LEDs, photons may make multiple passes to the semiconductor surface without being absorbed, increasing the probability that these photons can escape. Randomization of the direction of internally reflected light may occur as a result of scattering at the chip surface or within the chip, allowing more light to escape than that predicted by the single pass models of FIGS. 1a, 1b, 1c, and 1d. These effects can be significant. For TS AlGaAs LEDs, the maximum extraction efficiency is calculated to be 0.24, ignoring the effects of randomization. The extraction efficiency has been experimentally estimated to be 0.30, and the difference between the two values can be attributed to light randomization and extraction of multiple pass light from the LED chip.

Shadowing from absorbing contact layers/metallizations can affect the extraction efficiency. The metal/semiconductor alloy found in alloyed contacts between the metal contact and the semiconductor is highly absorbing. Non-alloyed contacts typically require the presence of a very heavily doped absorbing semiconductor layer adjacent to the contact. Most methods for forming contacts result in absorption of the light over the entire contact area. Various methods for avoiding such absorption have been proposed, including utilizing transparent contacts of indium-tin-oxide ("ITO"). These have generally not been implemented in commercial LEDs as a result of problems with contact resistance, manufacturability, or reliability.

After the light escapes from the chip, it must be focused into a usable radiation pattern. Typically, LEDs are packaged in a polymer, usually epoxy, which is shaped into a lens. The desired radiation pattern is obtained by the shape of the reflector cup and the epoxy lens. Limitations imposed by this relatively simple optical system make it difficult to focus light emitted from the edges or sides of the chip into the center of the radiation pattern. This is especially true for narrow viewing angle lamps whose radiation patterns possess a full-angle at half power ("FAHP")<15°. Light from the top of the chip is relatively easy to focus. For chips emitting the same flux, a chip with predominantly top surface emission will have a higher peak intensity in lamp form, especially for narrow viewing angle lamps, than a chip wherein a substantial amount of light is emitted from the chip's edges or sides.

SUMMARY OF THE DISCLOSURE

The present invention describes methods for the fabrication of TS LED chips with improved light extraction and optics, particularly increased top surface emission, and the TS LEDs so fabricated. Employing non-absorbing DBRs within the TS LED permits the fabrication of the LEDs described herein. The non-absorbing DBRs redirect light away from absorbing regions, e.g. contacts, within the chip, increasing the light extraction efficiency. The non-absorbing DBRs can also redirect light toward the top surface of the chip, improving the amount of top surface emission and the intensity of the packaged LED. These benefits are accomplished with optically non-absorbing layers, maintaining the advantages of a TS LED. These advantages include ~6 light escape cones, light randomization, and multiple pass light extraction.

The present invention will now be described in detail with reference to the figures listed and described below.

BRIEF DESCRIPTION OF THE FIGURES

FIG. 10b is the air-incident reflectivity spectrum of the DBR shown in FIG. 10a;

DETAILED DESCRIPTION OF THE PREFERRED EMBODIMENT

Figure 3:
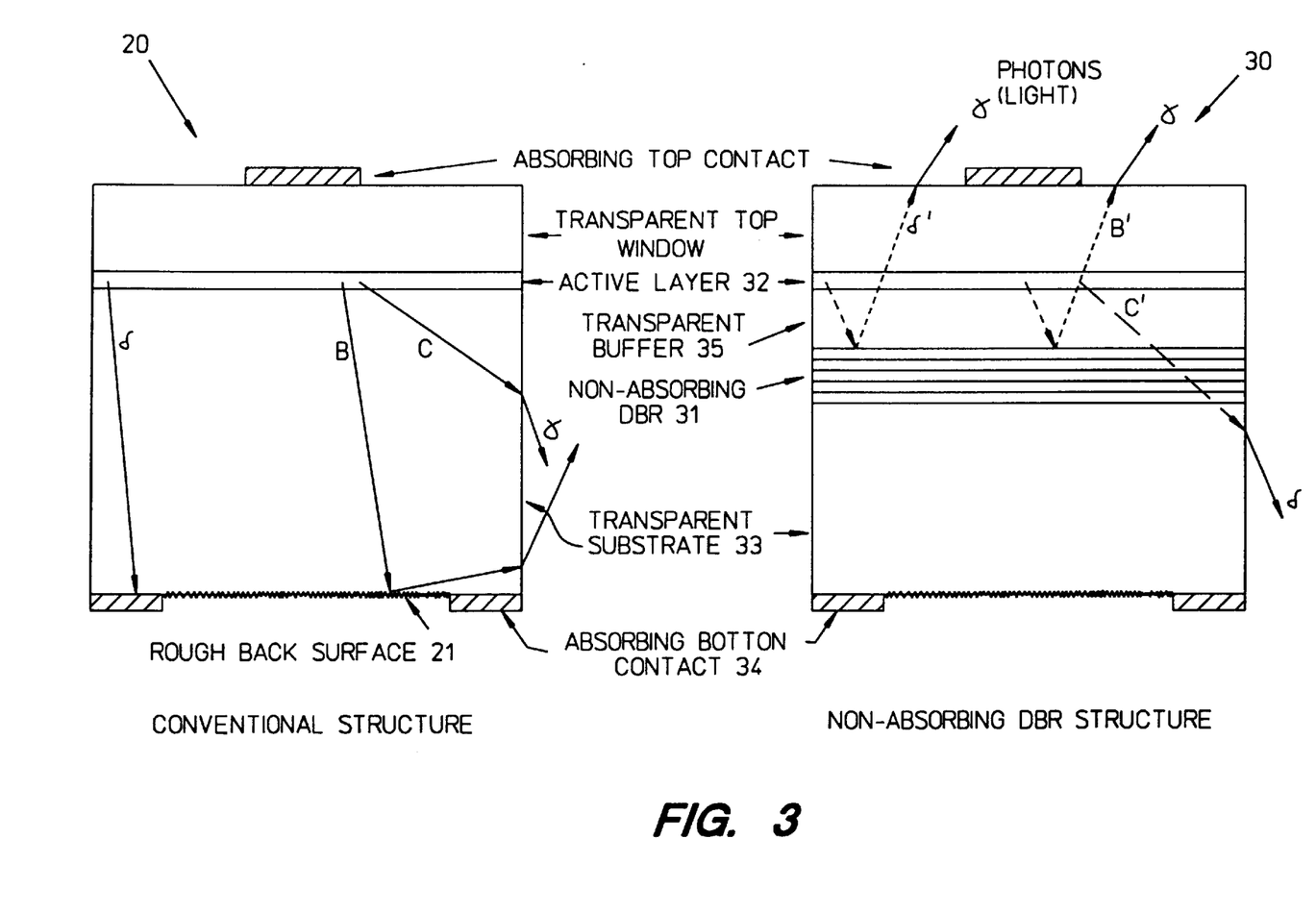

FIG. 3a is a schematic diagram of a conventional TS LED 20 and FIG. 3b is a schematic diagram of a TS LED 30 wherein a non-absorbing DBR 31 is placed beneath active region 32 of LED 30. Where components of LEDs 20 and 30 are the same, the same number has been used to designate both components. The non-absorbing DBR 31 reflects light of near normal incidence away from absorbing bottom patterned contacts 34. DBR stack 31 must be optically non-absorbing, meaning that all constituent layers must have a larger bandgap energy than that of the light emitted by active layer 32. This allows light which is not normally incident to pass through DBR 31, maintaining the advantages of the TS LED. Typically, absorbing back contacts 34 cover ~30% of the LED chip's back surface area. Considering only single pass light as in FIGS. 1, DBR 31 should yield at least an ~7% improvement in total extraction efficiency by redirecting light which is absorbed by the back contact in LED 20 (see ray traces δ and δ' in FIGS. 3a and 3b, respectively). This redirected light should translate into at least an ~17% increase in the amount of top surface light emission, which significantly improves the peak intensity in packaged lamps, especially those with narrow viewing angles. These narrow viewing angle lamps are strongly affected by the amount of top surface emission. The numbers herein only consider first pass light emission. The magnitude of the improvement in light extraction and increased surface emission may be substantially higher when multiple pass light is taken into account.

The peak intensity may be further improved by the non-absorbing DBR. In the conventional TS LED 20 shown in FIG. 3a, light of near-normal incidence reflected from rough back surface 21 is generally scattered so that it is emitted from the edges of the chip rather than the top surface (see ray trace β, FIG. 3a). This is caused by the roughness of the back semiconductor surface and/or the large grain size of the Ag-loaded reflective epoxy used for die-attaching the chips (see FIG. 2). The non-absorbing DBR 31 shown in FIG. 3b reflects the near-normal incident light toward the top surface, resulting in increased surface emission and improved peak intensity.

Figure 4:
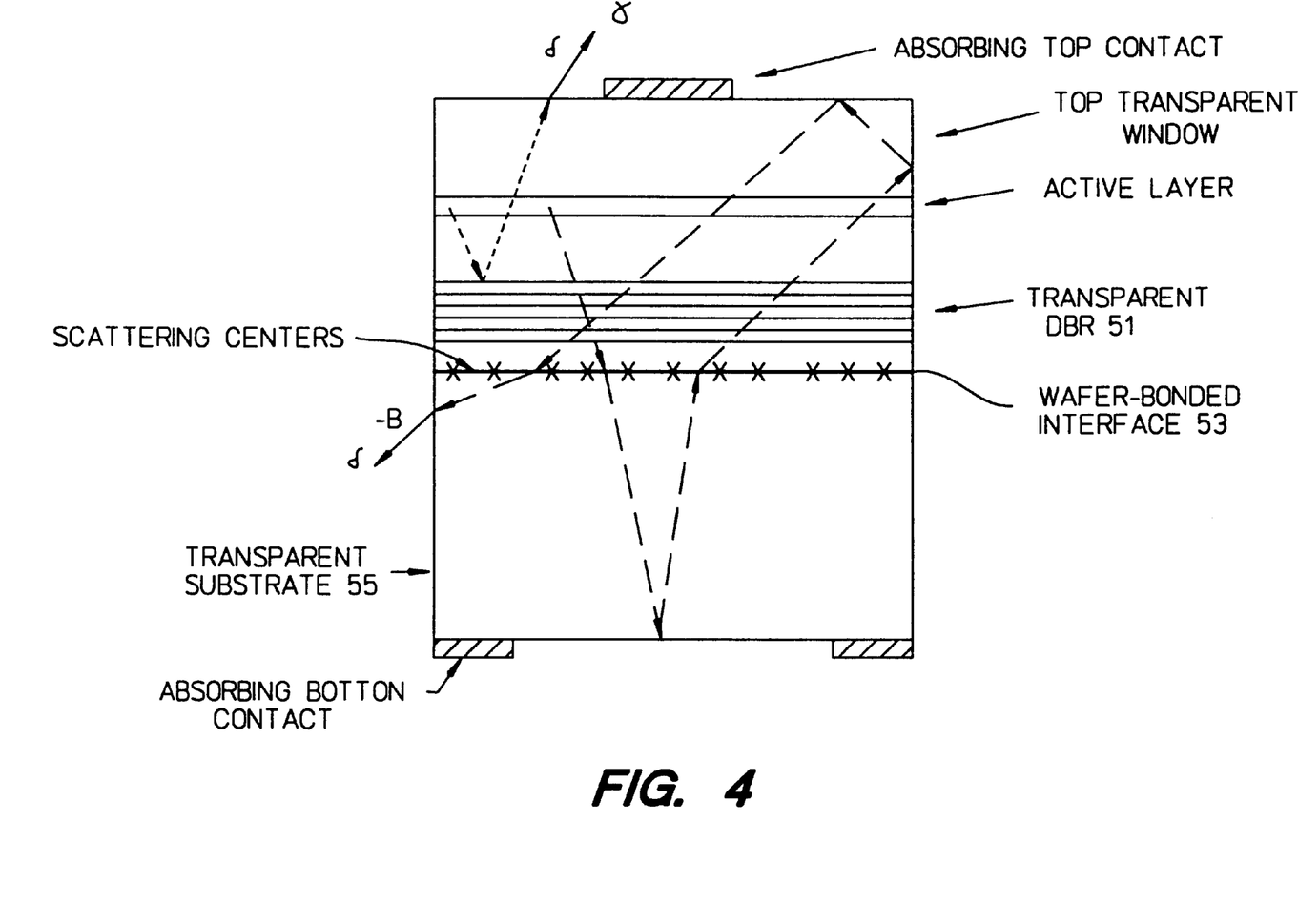
FIG. 4 illustrates an embodiment of the present invention using a wafer-bonded TS.

In most instances, the optimal location of the non-absorbing DBR is beneath active region 32, spaced only a short distance (<10 μm) away from the light emitting region. This spacing is achieved by using transparent buffer layer 35. This serves to minimize any absorption the light may undergo before being reflected. The DBR may also be located between the transparent substrate and the absorbing bottom contact 34, as long as absorption is sufficiently reduced. In specific TS LED structures, the optimal position may vary or be subject to further restrictions. For example, TS AlGaInP LEDs have recently been fabricated by removing the original optically absorbing growth substrate and replacing the original substrate with a TS using semiconductor wafer bonding. In this case, illustrated in FIG. 4, a non-absorbing DBR 51 is placed above the wafer bonded interface 53 to minimize any absorption or scattering that may occur at semiconductor wafer bonded interface 53. If the non-absorbing DBR is placed beneath the wafer bonded interface, the interface should be fabricated to minimize absorption.

Figures 5A, 5B:
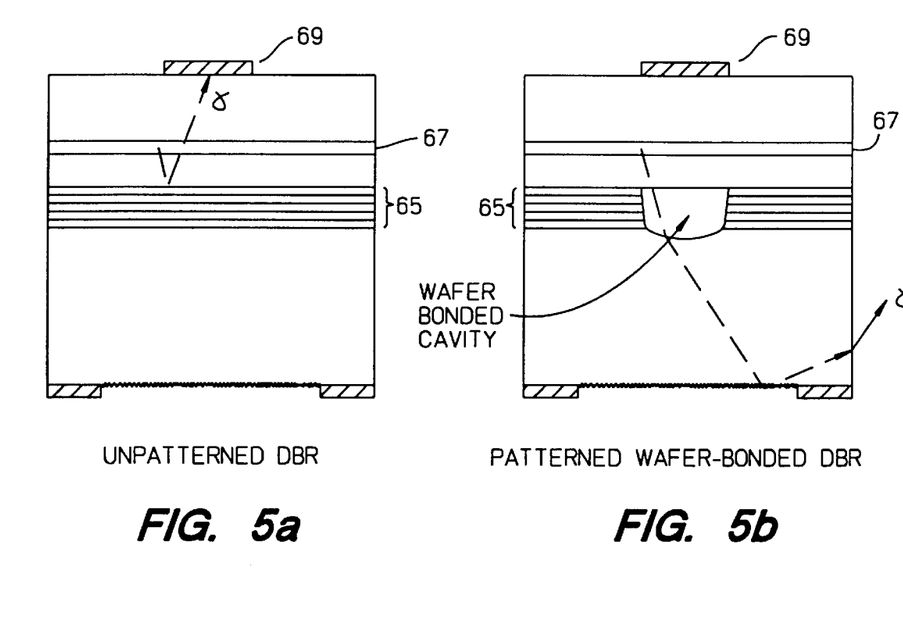
FIGS. 5a, 5b, and 5c respectively show a non-patterned DBR, a patterned DBR in a wafer-bonded TS LED, and a patterned DBR in an epitaxially grown TS LED.
Figure 5C:
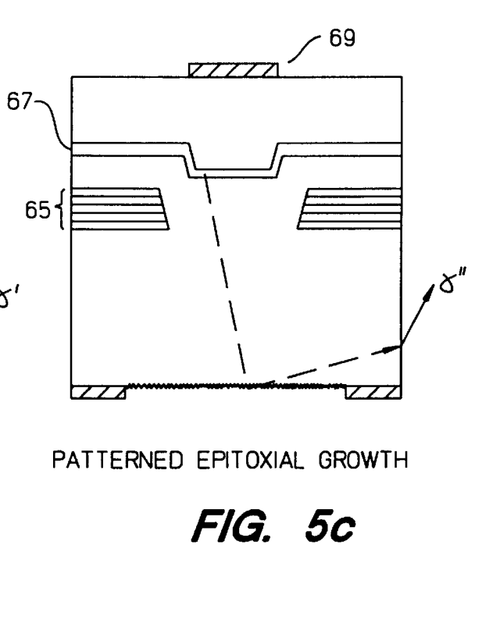

Lateral patterning of the non-absorbing DBR layers may be employed to further improve the properties of the TS LED. As shown in FIGS. 5a, 5b, and 5c, when DBR 65 is placed beneath the active layer 67, it may be advantageous not to place the DBR directly under top contact 69 to avoid the redirection of light towards this absorbing area. FIG. 5a illustrates a non-patterned DBR and how it might reflect light back to the absorbing top contact (see ray trace γ, FIG. 5a). The necessary patterning may be accomplished by patterned semiconductor wafer bonding (see FIG. 5b), epitaxial growth on patterned substrates (see FIG. 5c), multi-step epitaxial growth techniques, or a combination of these techniques. In the examples shown in FIGS. 5b and 5c, the light that might have been redirected toward top contact 69 is now directed out of the chips' sides (see ray traces γ' and γ", FIGS. 5b and 5c, respectively).

In TS LEDs incorporating non-absorbing DBRs, the addition of scattering sites within the chip may prove advantageous. Scattering sites would serve to redirect and randomize light within the chip. Randomization may be important to allow multiple pass light which is incident upon the DBR from the bottom of the chip to pass through the DBR and escape from the chip (see ray trace β in FIG. 4). Such scattering sites may consist of rough or non-uniform surfaces of the chip (created by such techniques as chemical etching, lapping, or sandblasting), cavities formed within the chip, changes in crystal composition/orientation, and epitaxial heterostructures, either patterned or unpatterned. The optimal position of such scattering centers would be beneath the non-absorbing DBR structure to avoid the scattering of light redirected by the DBR toward the top surface.

Figure 6:
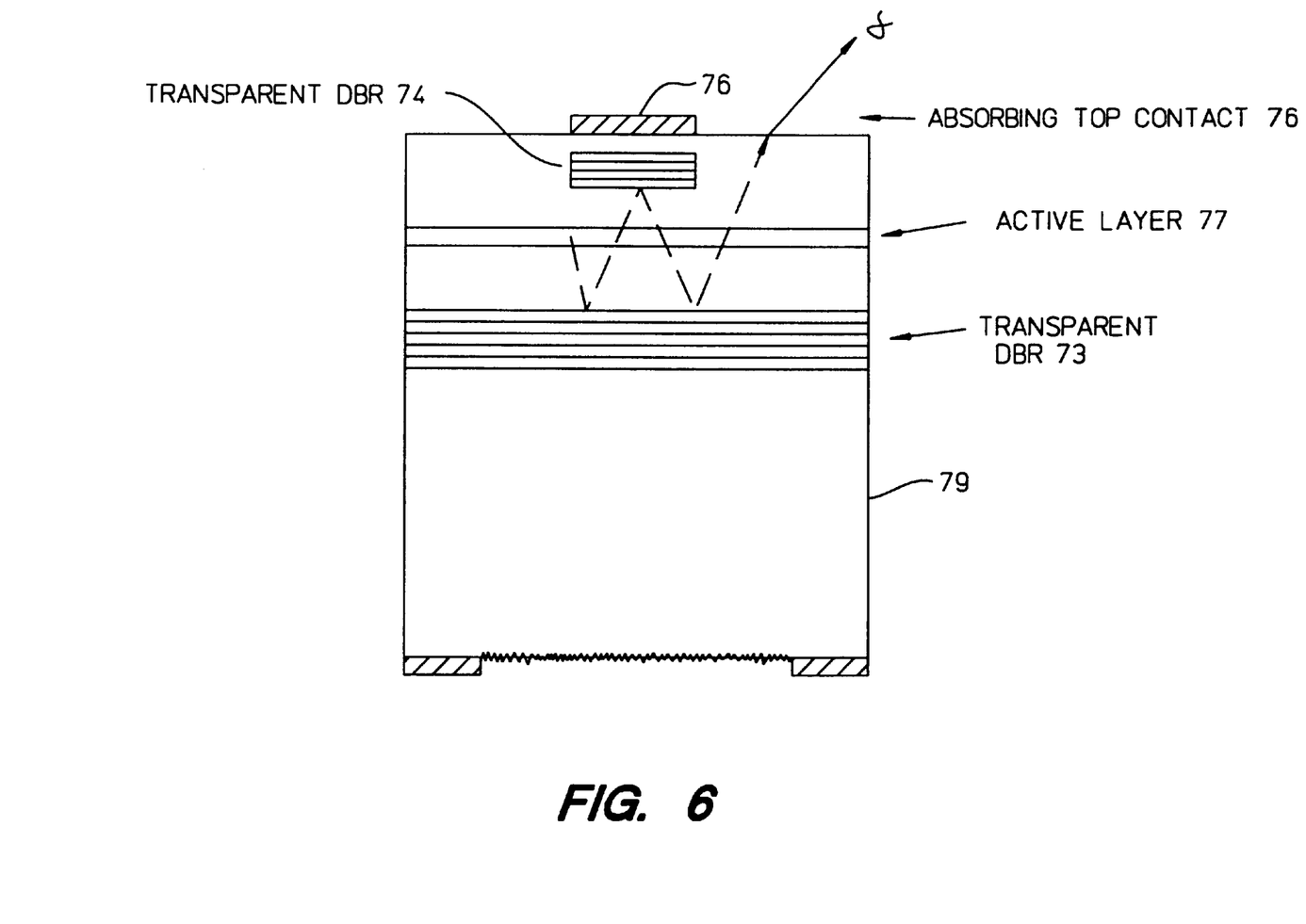
FIG. 6 illustrates a TS LED incorporating multiple non-absorbing DBRs.

Additional non-absorbing DBRs may be incorporated within the TS LED structure to achieve additional light extraction and/or the redirection of light toward a preferred area of the chip. When multiple DBRs are formed within the chip, it may be necessary to pattern one or more of the DBRs and/or introduce scattering centers between the DBRs to minimize the effects of the formation of Fabry-Perot cavities within the chip. These cavities tend to confine light within the chip. Typically, DBRs should be located between absorbing regions and the active layer of the LED. An example of a TS LED incorporating multiple non-absorbing DBRs is shown in FIG. 6 wherein a patterned DBR 74 is placed between the top contact 76 and the active layer 77 in addition to DBR 73 located between active layer 77 and substrate 79. DBR 74 reduces the amount of light which is incident upon the absorbing top contact, increasing the extraction efficiency of the LED. In practice, the number and placement of multiple DBRs will be dictated by the chip's structure and the complexity and cost required to fabricate such structures.

Figure 7A:
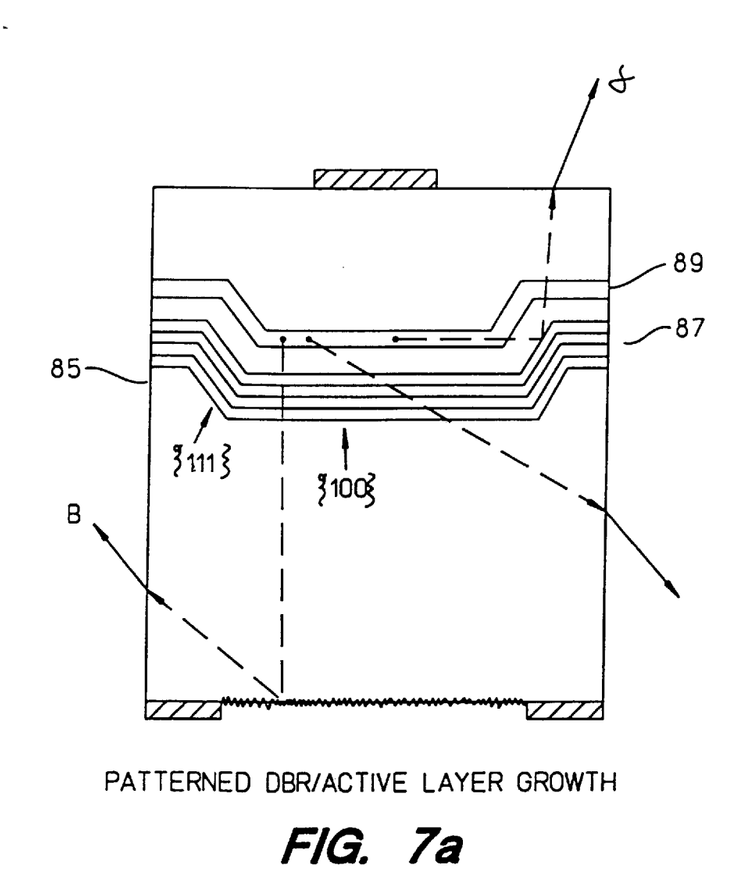
FIGS. 7a and 7b illustrate TS LEDs with patterned substrates and non-absorbing DBRs.
Figure 7B:
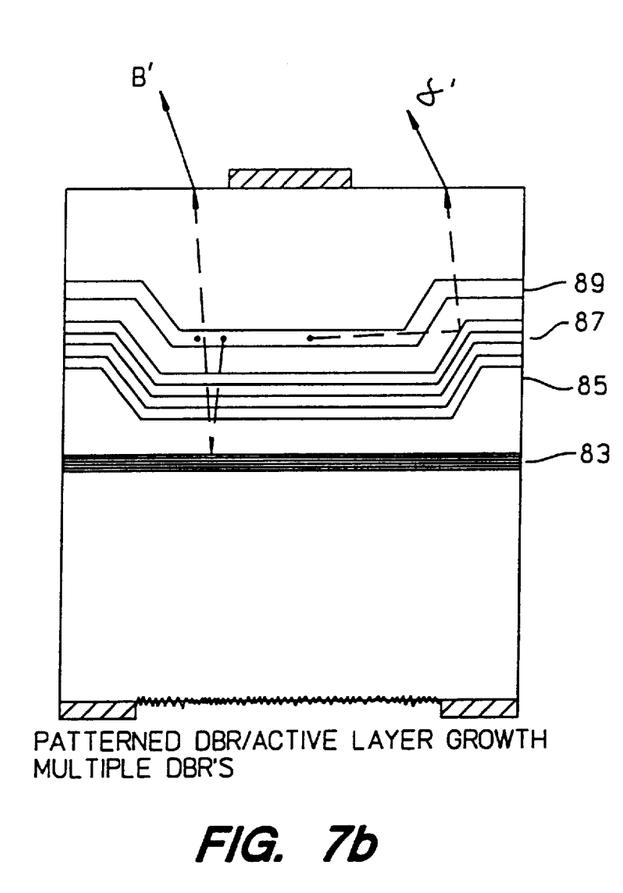

TS LED chip optics may also improve if the non-absorbing DBR and active layer are grown on a patterned substrate or on patterned epilayers. As shown in FIGS. 7a and 7b, the patterning would create trenches 85 with ~45° sidewalls (e.g., following the {111} planes of a (100) oriented substrate). This can be accomplished using standard etching techniques. If trenches 85 extend to a sufficient depth, the growth of non-absorbing DBR layers 87 and active layer 89 will result in a structure similar to that shown in FIG. 7(a). Light which is waveguided along active layer 89 may be reflected by DBR layers 87 on the ~45° trenches 85, redirecting the light to the surface of the chip (ray trace δ and δ', FIGS. 7a and 7b). Epitaxial growth rates vary substantially for growth on different growth planes. Consequently, in the structure shown in FIG. 7a, non-absorbing DBR 87 should be designed for high reflectivity of light of nominally 45° incidence. DBR layers 87 grown on the other crystal planes have significantly different thicknesses, and do not reflect light of near-normal incidence (ray trace β, FIG. 7a). In this case, it may be advantageous to employ a second non-absorbing DBR 83 beneath the patterned and regrown DBR 87 as shown in FIG. 7b. Although the TS LEDs shown in FIGS. 7a and 7b require growth on patterned substrates, the TS structure may be realized by direct growth of the active layer and DBR(s) on a transparent substrate, direct growth on an absorbing substrate (wherein the total thickness of the transparent layer is greater than 50 μm), followed by removal of the absorbing substrate, or by semiconductor wafer bonding. In other non-optimal cases, the patterning of the sidewalls may occur by etching other planes, yielding trenches with sidewalls different from 45° (30°–60°) but still having improved light output.

Figure 8:
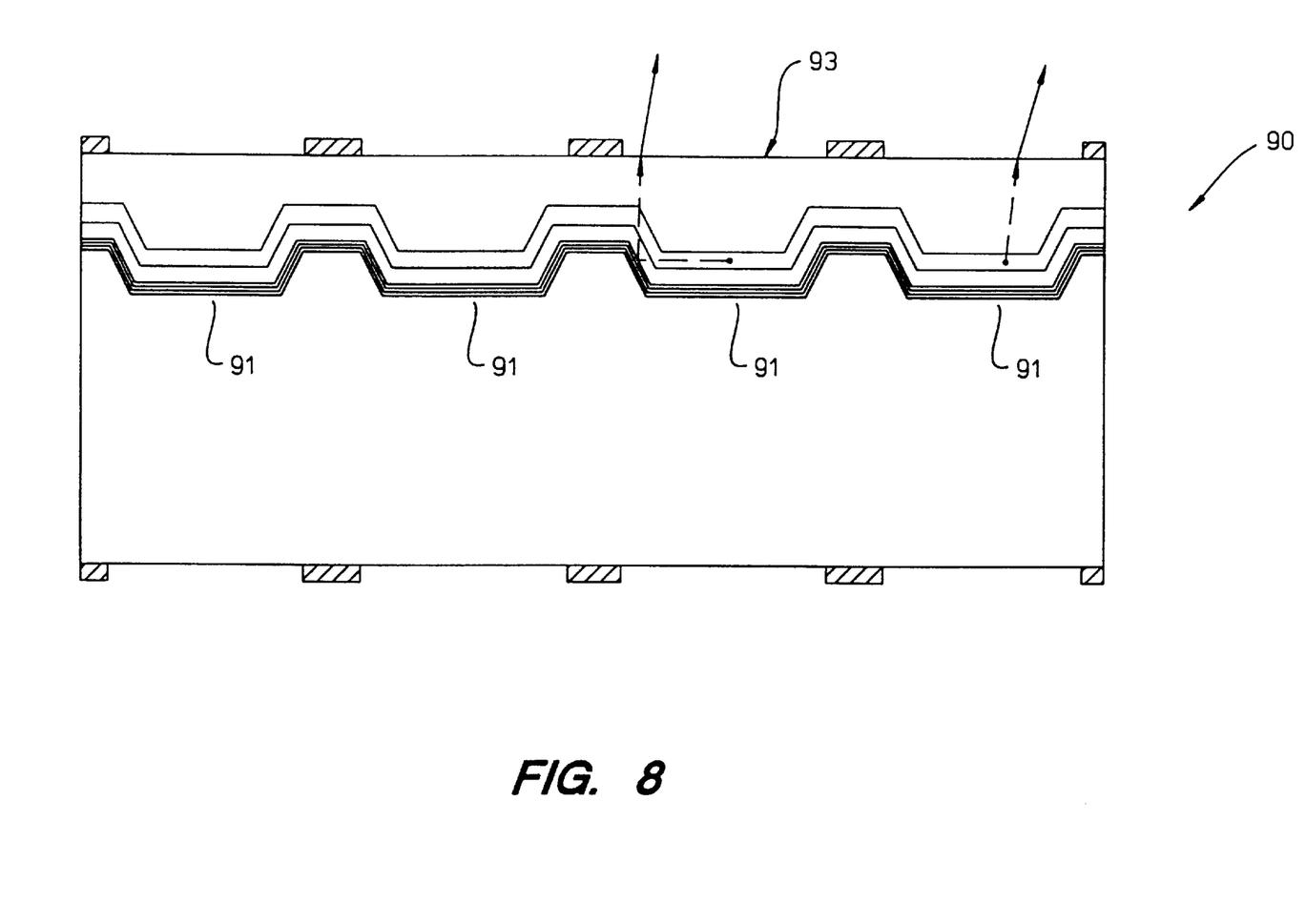
FIG. 8 illustrates a large area TS LED with a non-absorbing DBR, grown on a patterned substrate.

Light redirection via epitaxial growth of non-absorbing DBR/active layers on a patterned substrate can be used in large area chips to increase the extraction efficiency of the chip. Such an LED is shown in FIG. 8. Herein, repeated angled reflectors 91 are distributed across the chip to allow redirection of the edge-emitted light towards the surface 93 of the chip 90, allowing such light to escape. This edge emission typically escapes in small chips (<20×20 mils). In larger chips, this edge emitted light may be absorbed before it can reach the edges of the chip, resulting in decreased extraction efficiency. The structure shown in FIG. 8 serves to redirect the light toward a surface so it can escape from the chip before it can be absorbed. The angled reflectors should be spaced apart by less than 20 mils in each direction so as to make the large area chip act as an array of small-area chips.

Figure 9:
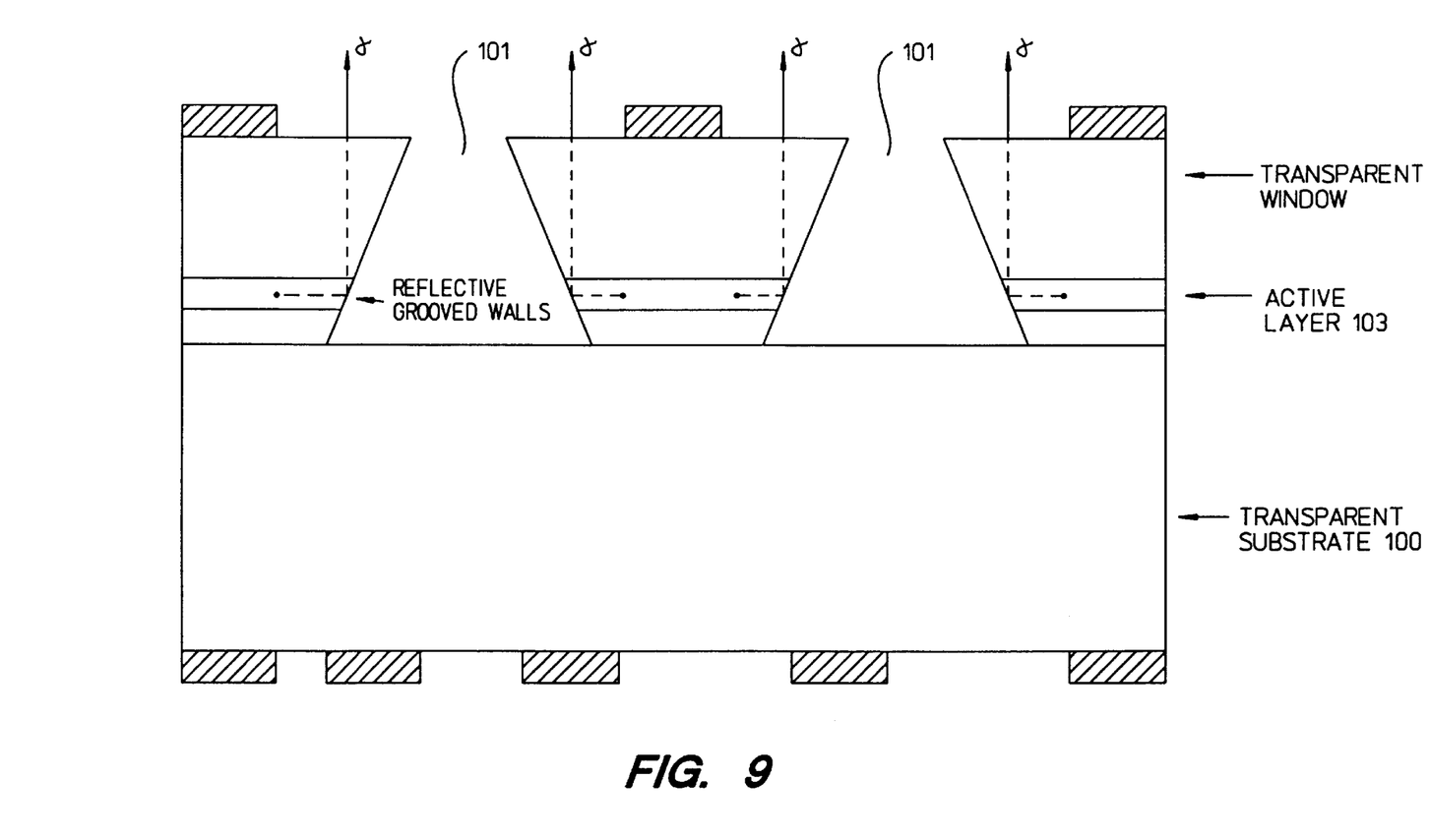
FIG. 9 illustrates a TS LED with grooved reflectors.

Etching angle grooves 101 in a chip 100, which grooves intersect or are in close proximity to active regions 103, shown in FIG. 9, can achieve similar results to the method used to fabricate the LEDs illustrated in FIG. 8. Light would be reflected and redirected by these surfaces so as to allow the light to escape from the chip. The reflectivity of these grooves may be improved by coating the groove surface with a reflective metal.

Various techniques can be used to fabricate non-absorbing DBRs in a TS LED structure. These techniques include epitaxial growth of the DBR, together with the active region of the device using such techniques as vapor phase epitaxy ("VPE"), liquid phase epitaxy ("LPE"), metalorganic chemical vapor deposition ("MOCVD"), molecular beam epitaxy ("MBE"), or a combination of these. The DBR and LED epitaxial layers may be formed by a single or multiple growth steps, with the order of growth determined by the desired chip structure. Additionally, a TS LED with a non-absorbing DBR may be formed by semiconductor wafer bonding. In this case, the DBR can be grown by epitaxial methods on a transparent substrate which is then bonded to the LED epitaxial layers. Alternatively and preferably, the LED structure may be grown upon the DBR, the combination of which is then wafer-bonded to a transparent substrate. This method minimizes absorption from the semiconductor wafer bonded interface and allows the incorporation of scattering centers below the DBR, such centers including cavities formed within the chip or local changes in crystal composition/orientation due to wafer bonding techniques.

A variety of DBR designs may be employed in the TS LED of this invention. These include, but are not limited to, standard quarter wavelength stacks, chirped stacks, multiple stacks with offset center wavelengths, interspersed stacks, and any combination of the above. The design should be chosen based on the desired characteristics of the DBR, including reflectivity, angular capture, material characteristics, and practical considerations for growth and implementation of the structures.

Ideally, all layers of the DBRs should be optically non-absorbing. However, practical considerations such as growth requirements and band offsets require that a small amount of absorption occurs in some or all of the layers of the DBR structure. Thus, the performance advantages of the DBR structure, e.g., increased surface emission, must be weighted relative to the increased absorption present in such structures. Optimally, the maximum total absorption that would allow the performance advantages described herein should be less than 25%, wherein the total absorption is defined as the total light not reflected or transmitted by the DBR as calculated by integrating over all angles of incidence.

Figure 10A:
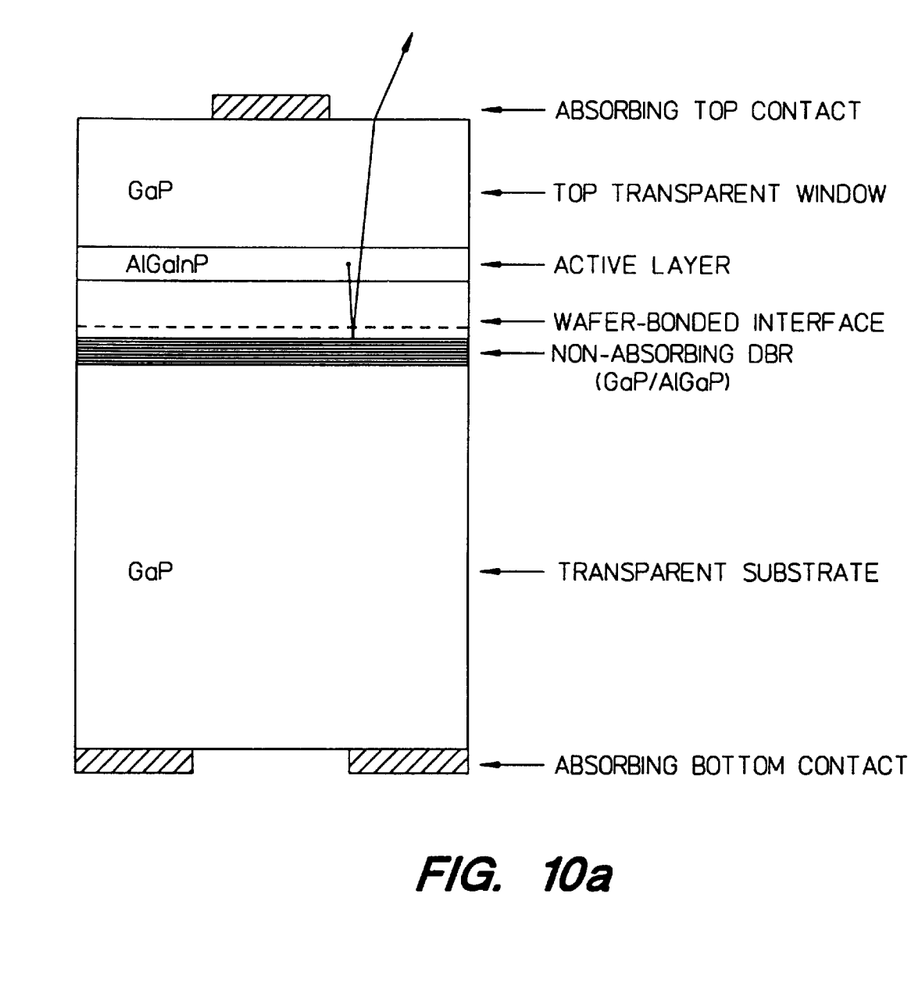
FIG. 10a is a schematic diagram of a TS AlGaInP LED with a non-absorbing DBR.
Figure 10B:
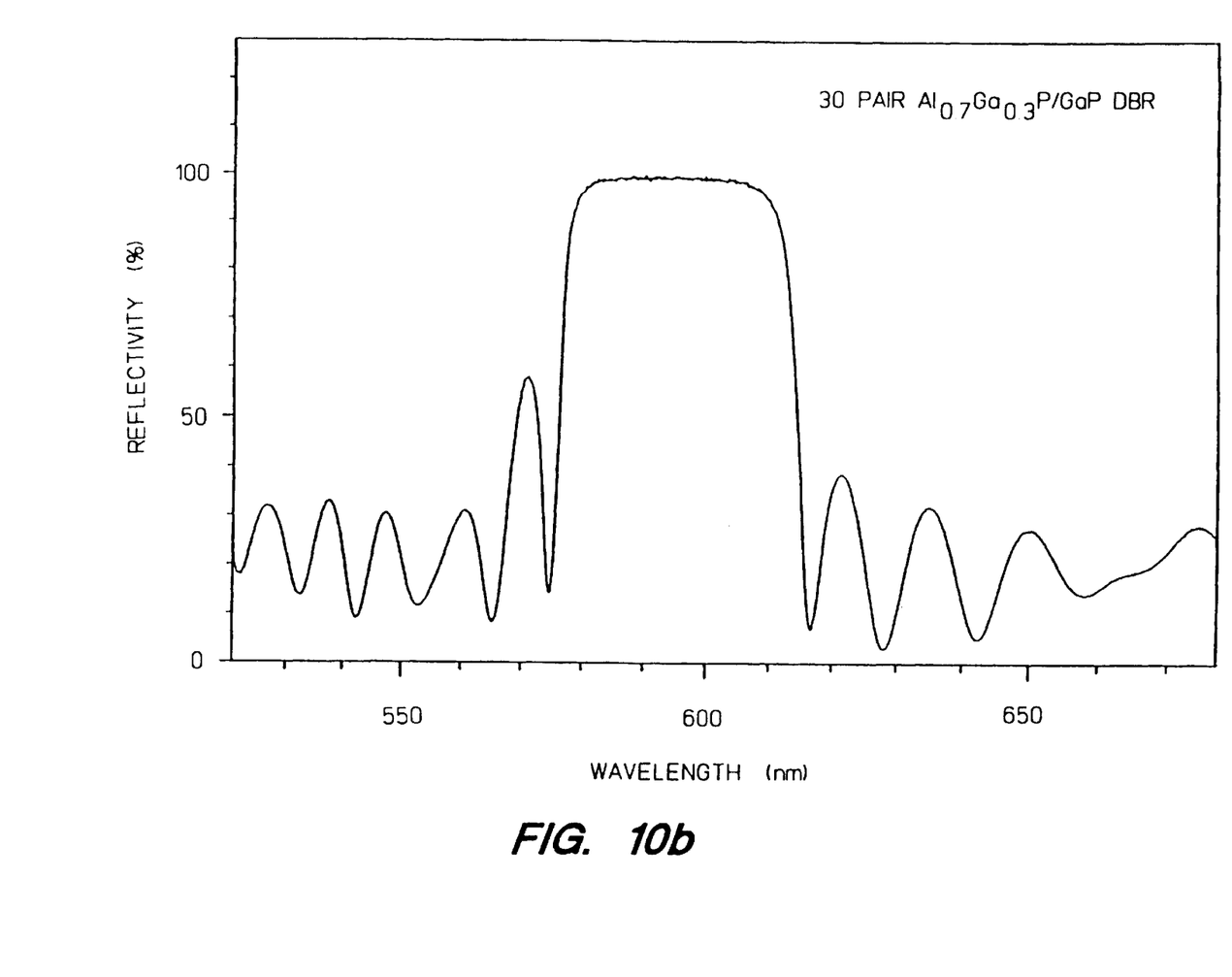

The design of the active layer is also critical to the realization of improved light extraction. A TS AlGaInP LED structure, shown schematically in FIG. 10a, was fabricated by wafer-bonding a GaP/Al$_{0.7}$Ga$_{0.3}$P DBR epitaxially grown on a GaP substrate by MOCVD to an AlInGaP LED structure with a 1.25 μm thick active layer which was removed from the original absorbing GaAs substrate. The 50 μm thick GaP window layer above the active layer was grown by VPE prior to removal of the GaAs substrate and improves current spreading in the device and handling of the thin AlGaInP active layer prior to wafer bonding. The air-incident reflectivity spectrum for the 30 period GaP/Al$_{0.7}$Ga$_{0.3}$P DBR is shown in FIG. 10b, indicating high reflectivity at the peak emission wavelength (590 nm) of the active layer. Testing of the LED structure revealed that the presence of the DBR resulted in a small red shift of the emitted light spectra, but did not result in a significant improvement in overall light extraction. Analysis showed that light reflected by the DBR was strongly attenuated due to band-to-band absorption in the active layer.

Figure 11A:
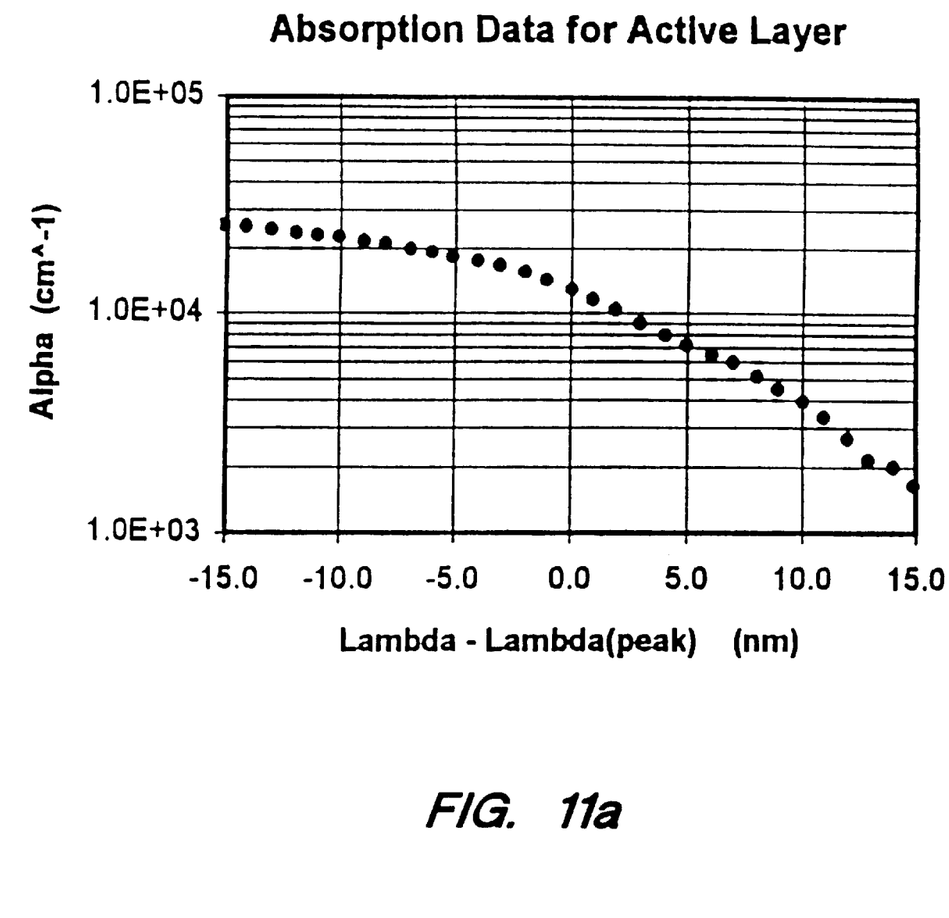
FIG. 11a is a graph of the absorption coefficient α plotted as a function of $\lambda-\lambda_{Peak}$ for an AlInGaP active layer.
Figure 11B:
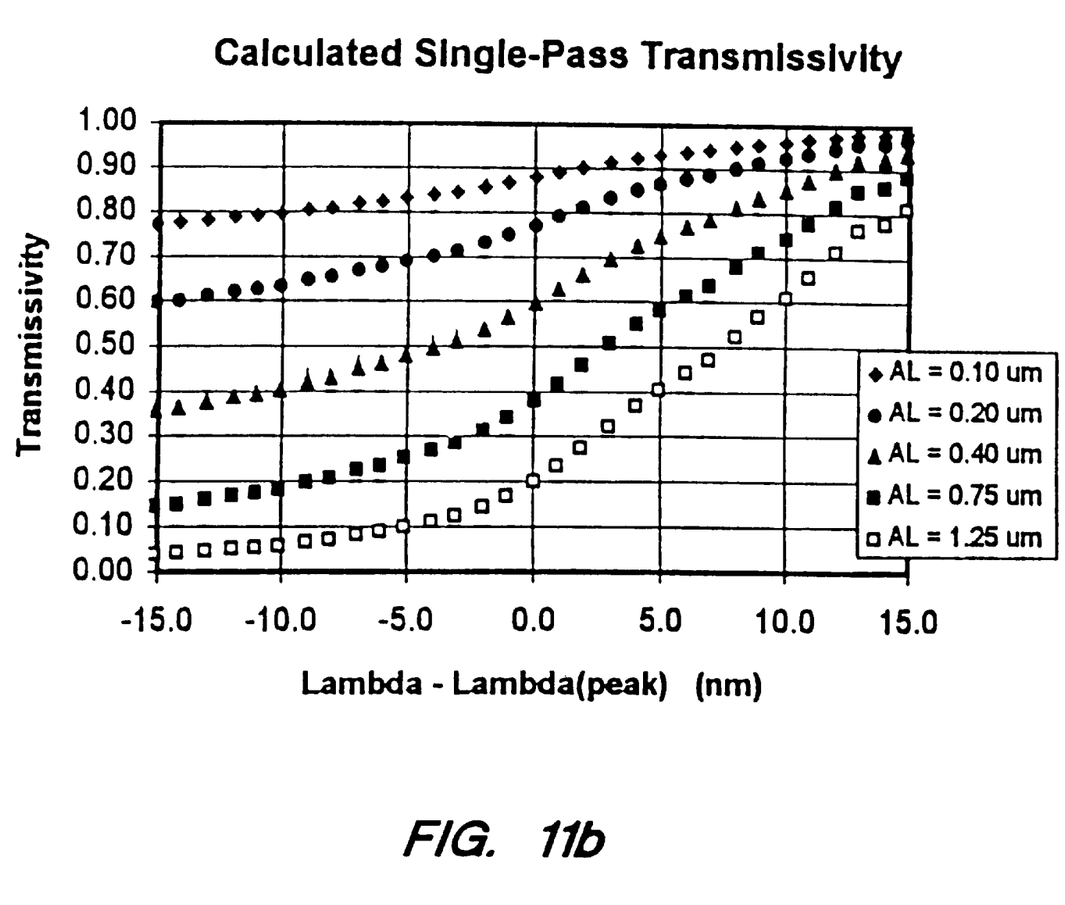
FIG. 11b is a graph of the single-pass transmission coefficient $e^{-\alpha x}$ as a function of $\lambda-\lambda_{Peak}$ for AlInGaP active layers of varying thickness.

The absorption coefficient α was measured and is plotted in FIG. 11a as a function of λ-λ$_{Peak}$, where λ$_{Peak}$ is the peak emission wavelength of the active layer. FIG. 11b shows the single pass transmission coefficient $e^{-\alpha X}$ as a function of λ-λ$_{Peak}$ peak for active layer thickness (X) ranging from 0.10 μm to 1.25 μm. This figure indicates that absorption is quite strong for X≧0.5 μm. For X=1.25 μm, only the long wavelength tail of the EL spectrum ($\lambda-\lambda_{Peak}>5$ nm) is able to pass through the active layer without being strongly absorbed, thereby accounting for the red shift observed in devices with a DBR. The photon recycling effect adds very little to the overall light extraction in devices with a DBR when the internal quantum efficiency $\eta_i$ in the active layer is significantly less than 100%, about 30% for this example.

To minimize the detrimental effect of absorption in the active layer, the active layer thickness should be less than 0.5 $\mu$m. Reduction in active layer thickness to less than 0.3 $\mu$m will result in further improvement in light extraction, as shown in FIG. 11b. Alternatively, the active region can consist of one or more quantum wells, each 500 Å thick or less, surrounded by stepped or graded bandgap regions for improved carrier confinement. The active region should have as high an internal quantum efficiency as possible to minimize the effect of absorption by re-emission of the absorbed light with probability $\eta_i$.

What is claimed is:

1. A method for fabricating a light emitting diode with a transparent substrate comprising the steps of:

fabricating at least a first distributed Bragg reflector reflecting light that strikes it within a first range of angles of incidence less than 25 degrees from normal and transmitting light with absorption less than 25% that strikes it within a second range of angles of incidence greater than 25 degrees from normal; and placing the first distributed Bragg reflector in the light emitting diode with the transparent substrate.

2. The method of claim 1 wherein the distributed Bragg reflector reflects light emitted by an active region of the light emitting diode in at least a first of two directions, the two directions being away from light absorbing areas of the light emitting diode and towards at least a first preferential direction.

3. The method of claim 2 wherein the active region is wafer bonded to a combination of the transparent substrate and the distributed Bragg reflector.

4. The method of claim 2 wherein the transparent substrate is wafer bonded to a combination of distributed Bragg reflector and active region.

5. The method of claim 1 wherein:

the transparent substrate has a top and a bottom surface; and the first distributed Bragg reflector is placed between an active region and one of the top and bottom surfaces of the transparent substrate.

6. The method of claim 5 further comprising the steps of:

fabricating a transparent window that has a top and bottom surface;

placing the bottom surface of the transparent window adjacent to the active region and opposing the top surface of the transparent substrate; and placing a second distributed Bragg reflector, that reflects light which strikes it within the first range of angles of incidence and transmits light which strikes it within the second range of angles of incidence, between the active region and one of the top and bottom surfaces of the transparent window.

* * * * *